(12) United States Patent
Van De Rijdt

(10) Patent No.: US 6,282,777 B1
(45) Date of Patent: Sep. 4, 2001

(54) COMPONENT PLACEMENT MACHINE

(75) Inventor: Johannes Hubertus Antonius Van De Rijdt, Eindhoven (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/469,329

(22) Filed: Dec. 22, 1999

(30) Foreign Application Priority Data

Dec. 29, 1998 (EP) .................................................. 98204475

(51) Int. Cl.[7] ........................................................ H05K 3/30
(52) U.S. Cl. ............................ 29/740; 29/743; 29/759; 29/741
(58) Field of Search ........................... 29/740, 759, 741, 29/833, 846, 743, 742; 414/730, 728; 198/817, 346.1, 346.2, 586

(56) References Cited

U.S. PATENT DOCUMENTS

| | | | |
|---|---|---|---|
| 4,805,000 | * | 2/1989 | Ogawa et al. ........................... 355/43 |
| 4,980,971 | * | 1/1991 | Bartschat et al. ....................... 29/833 |
| 5,084,959 | * | 2/1992 | Ando et al. ............................. 29/740 |
| 5,172,160 | * | 12/1992 | Van Eijk et al. ....................... 355/53 |
| 5,187,519 | * | 2/1993 | Takabayashi et al. ................. 355/53 |
| 5,446,519 | * | 8/1995 | Makinouchi ............................ 355/53 |
| 5,744,924 | * | 4/1998 | Lee ................................... 318/568.17 |
| 5,844,666 | * | 12/1998 | Van Engelen et al. ................ 355/72 |
| 5,864,833 | * | 1/1999 | Schaffer et al. ....................... 706/13 |

FOREIGN PATENT DOCUMENTS

9738567A1   10/1997   (WO).

* cited by examiner

*Primary Examiner*—Allan N. Shoap
*Assistant Examiner*—Minh Trinh
(74) *Attorney, Agent, or Firm*—Aaron Waxler

(57) ABSTRACT

In a component placement machine, a placement head (4) is driven by a linear motor (5). The stationary part (7) of the motor is attached to the machine frame (1) on which a PCB (8) is attached. The movable part (6) of the motor is connected to a slide (2) on which the placement head (4) is attached. During driving the placement head, reactive forces of the motor generate vibrations in the stationary part (7) of the motor and thus in the machine frame (20). This causes inaccuracies during the placement of components (9) on the PCB (8). To diminish this problem, the reactive forces are intercepted in a separate force frame (10) which is dynamically disconnected from the machine frame (1).

3 Claims, 4 Drawing Sheets

COMPONENT PLACEMENT MACHINE

BACKGROUND OF THE INVENTION

The invention relates to a component placement machine comprising
a machine frame over which printed circuit boards can be transported and on which the printed circuit boards can be fixed, which machine frame is provided with a guide member over which a slide can be moved,
a placement head for placing components on the printed circuit boards, which placement head is coupled to the slide,
a linear motor for driving the slide along the guide member in a drive direction, which motor has a stationary part and a movable part, which movable part is connected to the slide.

Such a component placement machine is known from WO-A1-97/38567. The principle of such a machine is diagrammatically represented in FIGS. 5 and 6, which show, respectively, a plan view and a side view of the machine. The stationary part 7 of the linear motor 5, i.e. a magnetic chuck, is rigidly attached to the machine frame 1. During operation, the coils, which constitute the movable part 6 of the linear motor and are situated on the slide, are energized in order to drive the slide 2 along the guide member 3. As a result, a reactive force is exerted on the magnetic chuck, which force is transmitted to the machine frame. These forces are largest during starting and stopping of the slide. The machine frame starts vibrating and hence also the printed circuit board 8 which is fixed onto the machine frame. The size of the frequency of the vibration and of the amplitude of the vibration are governed to a substantial degree by the size of the reactive forces and the rigidities and masses of the various machine parts. The machine parts serve as a mass-spring system. When the vibrations come close to the natural frequency of such a mass-spring system, unacceptable vibrations having large amplitudes may develop in the machine frame. The position where a component 9 must be placed on a printed circuit board by means of the placement head 4, which is attached on the slide 2, is determined by means of a vision system (not shown). However, said vision system cannot take into account the vibrations of the printed circuit board. The placement of a component takes place immediately after the slide has stopped, i.e. within, for example, approximately 10 $\mu$m. Since such vibrations generally do not damp out within this time interval, nor damp at least to an amplitude of a few $\mu$m, an inaccuracy occurs during the placement of the component. Postponing the placement until the vibrations have decreased to an acceptable level is unacceptable because it leads to an unacceptable increase of the process time.

SUMMARY OF THE INVENTION

It is an object of the invention to minimize the influence of said reactive forces, caused by the drive of the slide, on the machine frame.

To achieve this, the invention is characterized in that the stationary part of the motor is attached onto a force frame which is dynamically disconnected with respect to the machine frame. The reactive forces are now predominantly dealt with in the force frame instead of in the machine frame as in the state of the art. This is important because the position of the slide is measured with respect to the machine frame, not with respect to the force frame. By virtue of the dynamic disconnection, the vibrations caused thereby in the force frame are no longer, or only to a very limited degree, transmitted to the machine frame. Particularly the vibrations with a frequency close to the natural frequency of the whole of machine parts serving as the mass-spring system are not, or hardly, transmitted to the machine frame. As a result, the drive of the slide has no, or hardly any, influence on the position of the printed circuit board. This results in an increase of the accuracy with which the components are placed on the printed circuit board. The disconnection between the frames could be achieved, for example, by placing both frames separately on the shop floor so as to be disconnected. In this case, the vibrations in the force frame could still be transmitted to the machine frame via the floor. However, the vibrations are then damped to such an extent that the influence thereof on the machine frame is negligible. In practice, however, such a disconnection is almost unfeasible owing to, inter alia, the handling of the machine, the tolerances and calibrations.

Preferably, the force frame is dynamically disconnected with respect to the machine frame, only in the drive direction of the slide. In other directions, the force frame may be coupled to the machine frame. The reason for this being that the reaction forces in a linear motor extend substantially in the direction of the drive of the slide. Thus, the vibrations of the force frame are oriented substantially in this drive direction. As a result, it is possible to mechanically connect the force frame to the machine frame, so that one coherent framework is obtained.

An embodiment thereof is characterized in that the force frame is coupled to the machine frame by means of leaf springs, in such a manner that the leaf springs exhibit a small rigidity in the drive direction of the slide and a great rigidity in the other directions. A leaf spring has a very small mass and, in one direction, a very small rigidity.

Another embodiment is characterized in that a second slide is present on which the placement head is attached and which can be driven along a guide member of the first slide in a second drive direction at right angles to the first drive direction of the first slide by means of a second linear motor, a movable part of which is connected to the second slide, and a stationary part of which is dynamically disconnected with respect to the first slide. This enables the placement head to be positioned in two mutually perpendicular directions with respect to the machine frame and hence with respect to the printed circuit board, the reactive forces of the motors causing no, or hardly any, vibrations in said directions. Preferably, the stationary part is dynamically disconnected with respect to the first slide, only in the drive direction of the second slide. This can be achieved, in the same manner as in the first force frame, by coupling the stationary part of the second linear motor to the first slide by means of leaf springs, in such a manner that the stationary part has a small rigidity with respect to the first slide in the drive direction of the second slide, and a large rigidity in the other directions.

These and other aspects of the invention will be apparent from and elucidated with reference to the embodiments described hereinafter.

DESCRIPTION OF THE PREFERRED EMBODIMENTS

Figure 1:
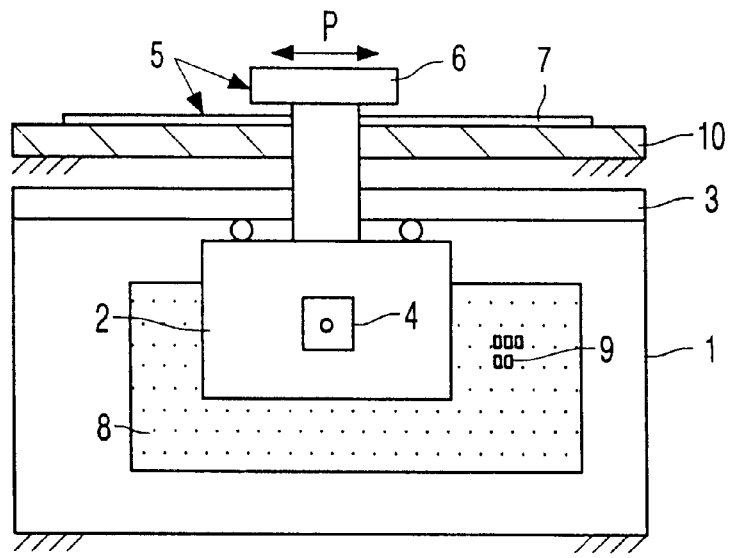
FIG. 1 is a diagrammatic plan view of a component placement machine wherein the principle of dynamically disconnecting the machine frame with respect to the force frame is represented.

In the simplified diagrammatic drawing shown in FIG. 1, reference numeral 1 denotes a machine frame. Along a guide bar 3 of the machine frame, a slide 2 can move to and fro in the direction indicated by the arrow P. On the slide there is a placement head 4 by means of which components 9 can be picked up from a stock of components. Printed circuit boards 8 can be transported over the machine frame 1 in known manner and, subsequently, can be fixed on the machine frame. By means of the placement head 4, the picked-up components 9 can be positioned on the printed circuit board 8. The drive of the slide 2 takes place by means of a linear motor 5. Said linear motor has a movable part, which is formed by a block of coils 6 and is attached onto the slide, and a stationary part, which is formed by a magnetic chuck 7. Said magnetic chuck is attached onto a separate frame, which is referred to as the force frame 10.

This force frame 10 is dynamically disconnected from the machine frame 1, i.e. the forces exerted on the force frame are not transmitted to the machine frame. The machine frame 1 and the force frame 10 are individually placed on the shop floor, without being coupled to each other. During driving the slide 2, the coils are energized to accelerate or decelerate the slide. This causes reactive forces on the magnetic chuck 7 and hence on the force frame 10. The force frame is contacted and starts vibrating. By disconnecting the frames, these vibrations are not, or only to a very limited extent, transmitted to the machine frame 1. The vibrations can be transmitted at most via the shop floor to the machine frame. However, by then the vibrations are damped so far that the influence which they exert is very small.

Figure 2:
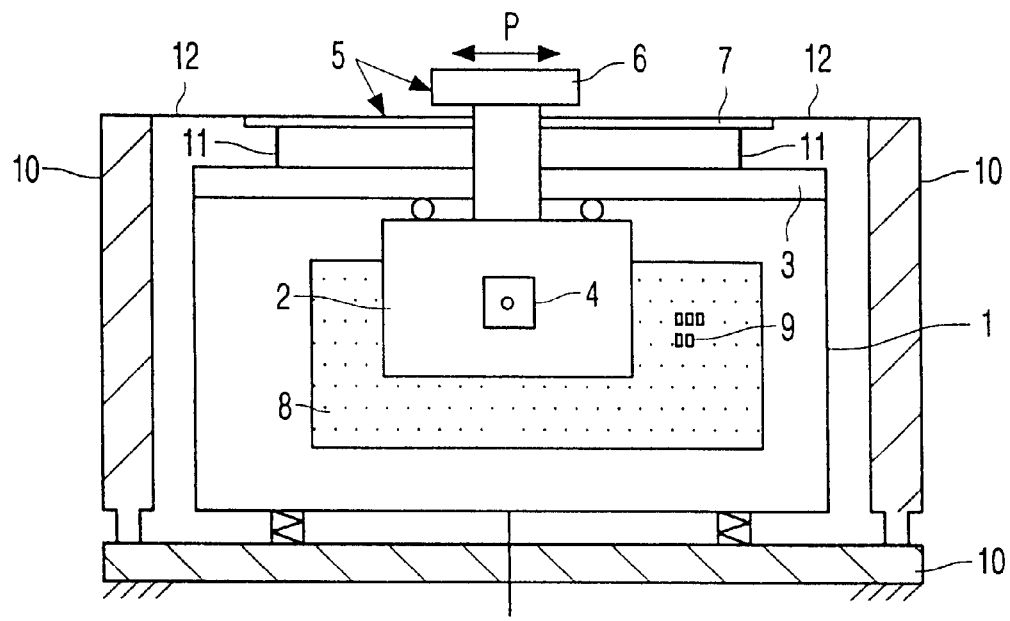
FIG. 2 is a diagrammatic plan view of a component placement machine wherein the machine frame and the force frame are disconnected only in the drive direction of the slide.

FIG. 2 diagrammatically shows the situation where the force frame 10 is disconnected with respect to the machine frame 1, only in the drive direction P of the slide 2. To achieve this, leaf springs 11 are provided between the magnetic chuck 7 and the machine frame 1. In the drive direction P, these leaf springs exhibit a small rigidity, and in the other directions they exhibit a large rigidity. The magnetic chuck 7 is connected to the force frame 10 in the drive direction, as indicated by means of the line 12. The reactive forces on the magnetic chuck 7, and hence on the force frame 10, substantially act in the drive direction P. The vibrations of the force frame 10 thus caused are hardly transmitted to the machine frame 1.

Figure 3:
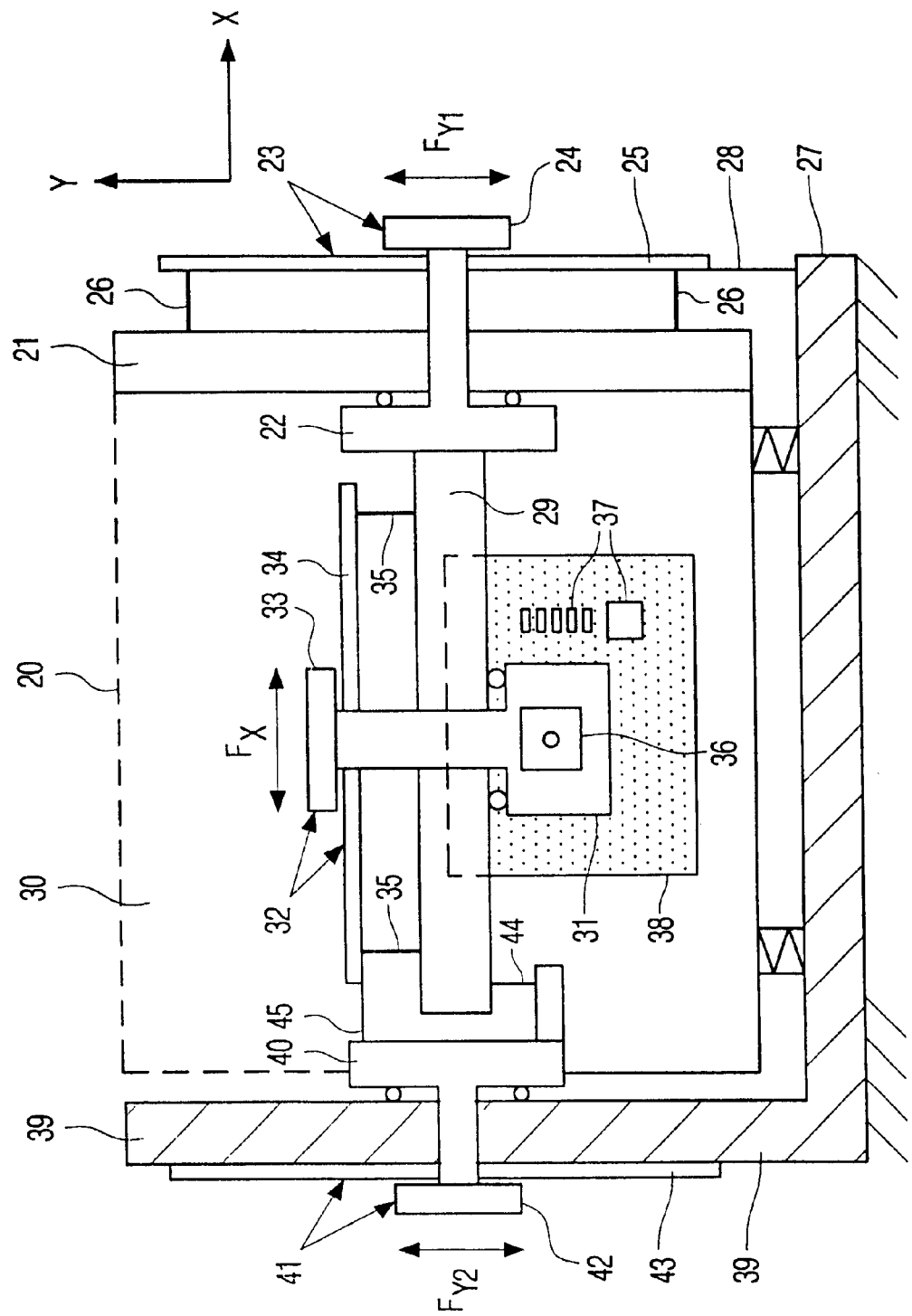
FIG. 3 is a diagrammatic plan view of a more complex component placement machine comprising a plurality of slides and dynamic disconnections in accordance with the invention.

FIG. 3 diagrammatically shows a component placement machine, wherein the placement head can move in an X-direction as well as an Y-direction, and wherein the reactive forces of the motors exerted on the machine frame, and hence on the position of the printed circuit board, are minimized. A Y1-guide bar 21 is attached onto the machine frame 20. Along the guide bar 21, a first slide 22 can move in the Y-direction. The slide 22 is driven by a first linear motor 23. The motor is formed by a block of coils 24, which is attached onto the slide 22, and a magnetic chuck 25. Said magnetic chuck is connected to the Y1-guide bar 21 by means of leaf springs 26. In the drive direction of the slide 22, i.e. the Y-direction, these leaf springs exhibit a small rigidity. The magnetic chuck 25 is rigidly connected to a force frame 27 in the Y-direction. This is indicated by means of the line 28. An X-guide bar 29 is attached to the first slide 22 and is oriented transversely to the Y1-guide bar 21. The X-guide bar extends over the work face 30 of the machine frame 20. Along the X-guide bar 29, a second slide 31 can move in the X-direction. The second slide is driven by a second linear motor 32. The motor is formed by a block of coils 33, which is attached onto the second slide, and a magnetic chuck 34. The magnetic chuck 34 is connected to the X-guide bar 29 by means of leaf springs 35. In the drive direction of the slide 31, i.e. the X-direction, these leaf springs exhibit a small rigidity. On the slide there is a placement head 36. By means of this placement head, components 37 can be placed on a printed circuit board 38. The printed circuit board is situated on the work face 30 of the machine frame 20 and can be transported over this frame. During the placement of components, the printed circuit board is fixed on the work face. A Y2-guide bar 39 is attached onto the force frame 27. This guide bar is situated opposite the Y1-guide bar 21 on the other side of the machine frame 20. A third slide 40 can move along the guide bar 39. The slide 40 is driven by a third linear motor 41. The motor is formed by a block of coils 42, which is attached onto the slide 40, and a magnetic chuck 43 which is rigidly attached onto the force frame. The X-guide bar 29 is connected to the slide 40. This is indicated by means of the line 44. This connection has a low rigidity in the X-direction and a high rigidity in the Y-direction. The magnetic chuck 34 of the second linear motor is also connected to the slide 40. This is indicated by means of the line 45. This connection has a high rigidity in the X-direction.

Figure 4:
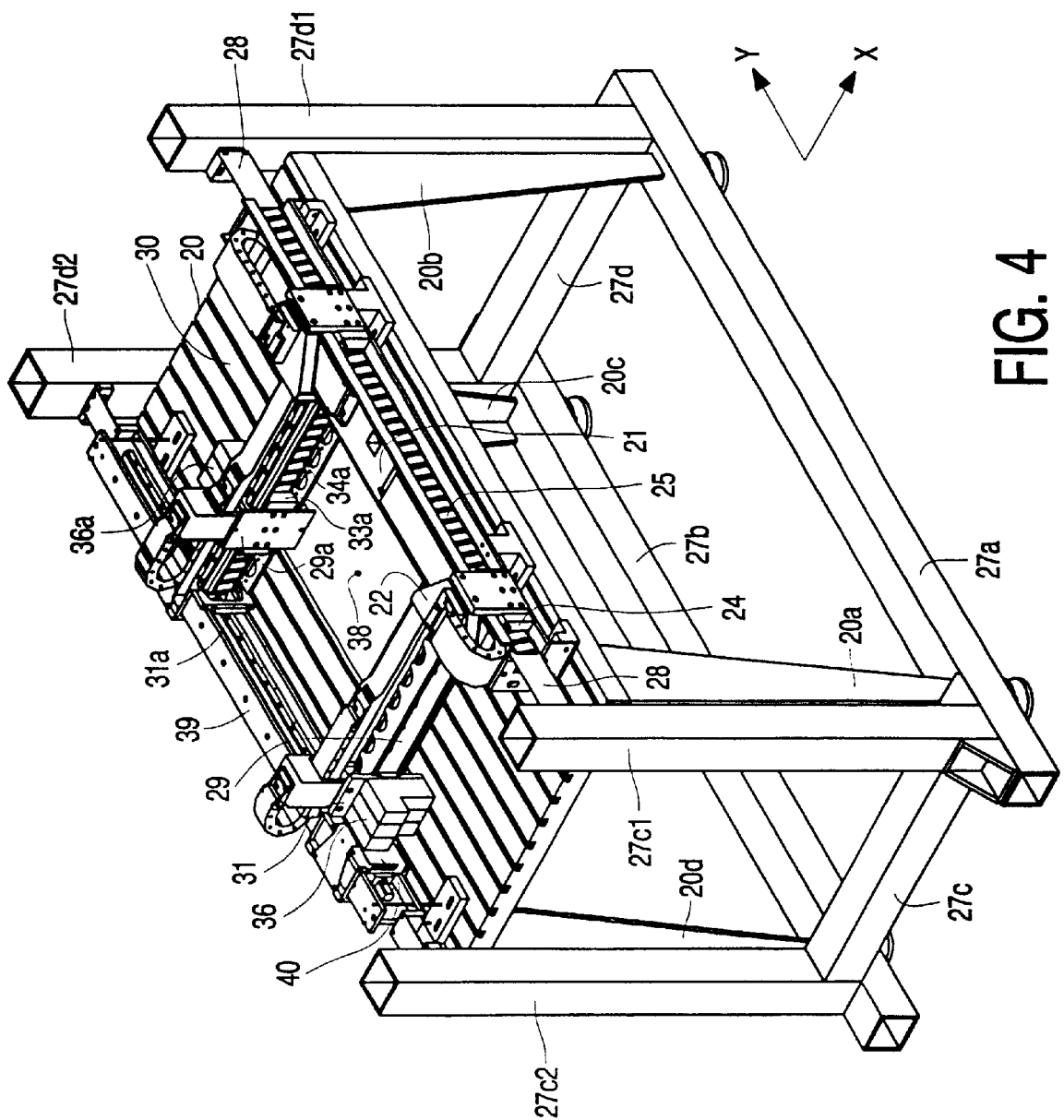
FIG. 4 is a perspective view of the component placement machine shown in FIG. 3.

FIG. 4 shows, in a more realistic arrangement, the diagrammatic situation shown in FIG. 3. The reference numerals used in FIG. 3 are also used in FIG. 4. The machine frame 20 is provided with legs 20a,b,c,d. The force frame 27 is formed by two horizontal bars 27a, 27b on which two U-shaped bars 27c, 27d are attached in the vertical direction. The four upright bars 27c1, 27c2, 27d1, 27d2 of the U-shaped bars are situated at the corner points of a rectangle between which the machine frame 20 is situated. The four legs 20a,b,c,d of the machine frame are attached onto the horizontal bars 27a, 27b of the force frame. The Y1-guide bar 21 is attached onto the machine frame 20. The magnetic chuck 25 of the first linear motor 23 is connected, by means of thin strips 28, to the two vertical bars 27c1, 27cd1 of the force frame. The strips have a low rigidity in the X-direction, and a high rigidity in the Y-direction. In FIG. 4, the leaf springs 26 are not shown. They are situated between the magnetic chuck 25 and the Y1-guide bar 21. The Y2-guide bar 39 is secured between the other two vertical bars 27c2, 27d2 of the force frame. Between the first slide 22 and the third slide 40, there is the X-guide bar 29 on which the second slide 31 with the placement head 36 is provided. FIG. 4 shows that it is also possible to arrange a second X-guide bar 29a with a slide 31 a and a placement head 36a between the two Y-guide bars. In this case, two components can be placed simultaneously. The magnetic chuck 34a and the block of coils 33a of the second linear motor 32 are visible at the location of the second X-guide bar 29a.

Figure 5:
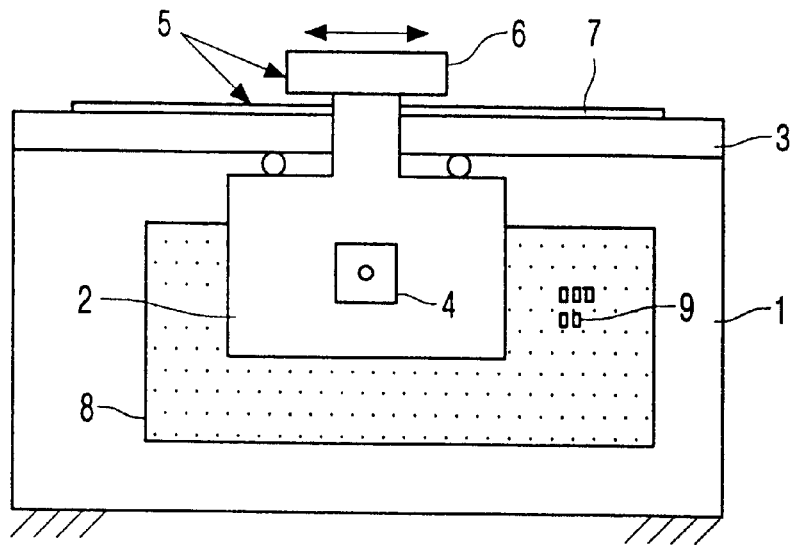
FIG. 5 is a diagrammatic plan view of a conventional component placement machine.
Figure 6:
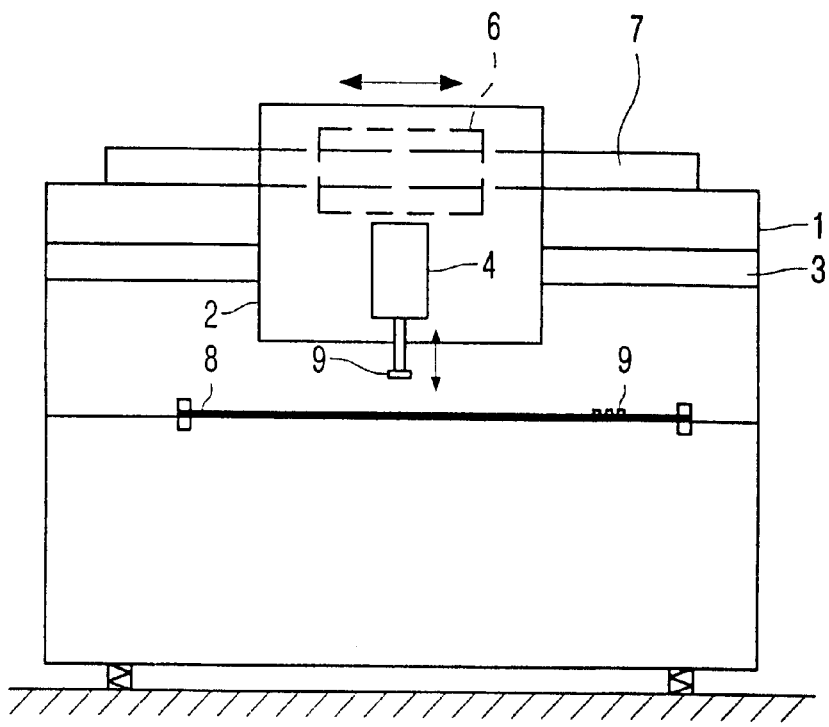
FIG. 6 is a diagrammatic side view of the conventional component placement machine shown in FIG. 5.

With reference to FIGS. 4 and 5, it will be explained that reactive forces acting on the magnetic chucks of the linear motors do not, or hardly, influence the machine frame 20. To move the placement head 36 to a certain Y-position above the work face 30, it is necessary to activate the motors 23 and 41. The reactive forces Fy1, which are exerted on the magnetic chuck 25 as a result of energizing the coils 24 of the first linear motor 23, are not, or hardly, transmitted in the Y-direction to the Y1-guide bar 21 by virtue of the leaf springs 26. This can be partly attributed of course to the rigidity of the leaf springs. The rigidity of the leaf springs should be chosen to be such that the vibrations caused have a frequency which is at least outside the range of the natural frequency of the machine parts acting as a mass-spring system. The low-frequency vibrations are not transmitted by the shop floor. The high-frequency vibrations have a small amplitude and constitute no problem. These reactive forces can contact the vertical bars 27c1 and 27d1 of the force frame 27 in the Y-direction via the strip 28, but this does not, or hardly, influence the machine frame 20. Although the vertical bars 27c1 and 27d1 of the force frame and the legs 20a and 20b of the machine frame are attached onto the horizontal bar 27a, vibrations caused by the reactive forces Fy1 exerted on the vertical bars 27c1 and 27d1 are hardly transmitted to the machine frame 20 because the horizontal bar 27a is attached to the shop floor. The reactive forces Fy2, which are exerted on the magnetic chuck 43 as a result of energizing the coils 42 of the third linear motor 41, are transmitted in the Y-direction to the force frame 20, however, the influence thereof is also very small. In the same manner as described hereinabove, the vertical bars 27c2 and 27d2 hardly influence the machine frame, because these vertical bars are attached onto the horizontal bar 27b which, in turn, is attached to the shop floor. To move the placement head 36 in the X-direction by means of the second linear motor 32, reactive forces Fx are exerted on the magnetic chuck 34, which forces are caused by energizing the coils 33. Thanks to the leaf springs 35, however, these forces are not, or hardly, transmitted in the X-direction to the horizontal X-guide bar 29. The reactive forces Fx may touch the third slide 40 in the X-direction (indicated by means of the line 45 in FIG. 3) and hence cause the force frame 27 to vibrate in the X-direction. However, by virtue of the above-mentioned attachment of the horizontal bars 27a, 27b of the force frame to the shop floor, these vibrations are not, or hardly, transmitted to the machine frame.

A linear motor has a stationary part and a movable part, the stationary part generally being the magnetic chuck and the movable part generally being the block of coils. Of course, this may also be the other way round.

It is also possible to place more than one slide with a placement head on one X-guide bar and/or, as indicated hereinabove, to provide a second X-guide bar with a slide and a placement head. By virtue of the dynamic disconnection in the drive direction of the slides, the dynamic disturbance occurring when a plurality of slides are simultaneously driven is only small.

What is claimed is:

1. A component placement machine comprising
    a machine frame (1, 20) over which printed circuit boards (8, 38) can be transported and on which the printed circuit boards can be fixed, which machine frame (1, 20) is provided with a guide member (3, 21) along which a slide (2, 22) can be moved,
    a placement head (4, 36) for placing components (9, 37) on the printed circuit boards, which placement head is coupled to the slide,
    a linear motor (5, 31) for driving the slide (2, 22) along the guide member (3, 21) in a drive direction (P, Y), which motor has a stationary part (7, 25) and a movable part (6, 24), which movable part is connected to the slide, characterized in that the stationary part (7, 25) of the motor (5, 33) is attached to a force frame (10, 27) which is dynamically disconnected with respect to the machine frame (1, 20, characterized in that the force frame (10, 27) is dynamically disconnected with respect to the machine frame (1, 20), only in the drive direction (P, Y) of the slide (2, 22), and further characterized in that the force frame (10, 27) is dynamically disconnected with respect to the machine frame (1, 20), only in the drive direction (P, Y) of the slide (2, 22), and further characterized in that the force frame (10, 27) is coupled to the machine frame by means of leaf springs (11, 26) in such a manner that the leaf springs (11, 26) exhibit a small rigidity in the drive direction (P, Y) of the slide (2, 22) and a great rigidity in the other directions.

2. A component placement machine comprising:
    a machine frame (1, 20) over which printed circuit boards (8, 38) can be transported and on which the printed circuit boards can be fixed, which machine frame (1, 20) is provided with a guide member (3, 21) along which a slide (2, 22) can be moved,
    a placement head (4, 36) for placing components (9, 37) on the printed circuit boards, which placement head is coupled to the slide,
    a linear motor (5, 31) for driving the slide (2, 22) along the guide member (3, 21) in a drive direction (P, Y), which motor has a stationary part (7, 25) and a movable part (6, 24), which movable part is connected to the slide, characterized in that the stationary part (7, 25) of the motor (5, 33) is attached to a force frame (10, 27) which is dynamically disconnected with respect to the machine frame (1, 20), characterized in that a second slide (31) is present on which the placement head (36) is attached and which can be driven along an X-guide member (21) of the first slide (22) in a second drive direction (X) at right angles to the first drive direction (Y) of the first slide by means of a second linear motor (32), a movable part (33) of which is connected to the second slide (31), and a stationary part (34) of which is dynamically disconnected with respect to the first slide (22), characterized in that the stationary part (34) is dynamically disconnected with respect to the first slide (22) only in the drive direction (X) of the second slide (31), characterized in that the stationary part (34) of the second linear motor (32) is coupled to the first slide (22) by means of leaf springs (35), in such a manner that the leaf springs (35) have a small rigidity in the drive direction (X) of the second slide (31) and a large rigidity in the other directions.

3. A component placement machine comprising:
    a machine frame (1, 20) over which printed circuit boards (8, 38) can be transported and on which the printed circuit boards can be fixed, which machine frame (1, 20) is provided with a guide member (3, 21) along which a slide (2, 22) can be moved,
    a placement head (4, 36) for placing components (9, 37) on the printed circuit boards, which placement head is coupled to the slide,
    a linear motor (5, 31) for driving the slide (2, 22) along the guide member (3, 21) in a drive direction (P, Y), which motor has a stationary part (7, 25) and a movable part (6, 24), which movable part is connected to the slide, characterized in that the stationary part (7, 25) of the motor (5, 33) is attached to a force frame (10, 27) which is dynamically disconnected with respect to the machine frame (1, 20), characterized in that a second slide (31) is present on which the placement head (36) is attached and which can be driven along an X-guide member (21) of the first slide (22) in a second drive direction (X) at right angles to the first drive direction (Y) of the first slide by means of a second linear motor (32), a movable part (33) of which is connected to the second slide (31), and a stationary part (34) of which is dynamically disconnected with respect to the first slide (22), characterized in that a third slide (40) is present which can move along a guide member (39) of the force frame (27) in a direction parallel to the direction of movement (X) of the first slide (22), the first and the third slide being interconnected by means of the X-guide member (29), said third slide (40) being drivable by means of a third linear motor (41) the stationary part (43) of which is secured to the force frame (27), and the connection between the third slide (40) and the X-guide member (29) having a small rigidity in the direction of movement (X) of the second slide (22), and further characterized in that the connection between the third slide (40) and the X-guide member (29) is formed by a leaf spring (44) having a low rigidity in the X-direction and a high rigidity in the Y-direction.

* * * * *